(12) United States Patent
Gao et al.

(10) Patent No.: US 12,249,398 B2
(45) Date of Patent: *Mar. 11, 2025

(54) DATA TRANSMISSION CIRCUIT, DATA TRANSMISSION METHOD AND STORAGE DEVICE

(71) Applicant: CHANGXIN MEMORY TECHNOLOGIES, INC., Hefei (CN)

(72) Inventors: Enpeng Gao, Hefei (CN); Kangling Ji, Hefei (CN); Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/757,321

(22) PCT Filed: Aug. 12, 2021

(86) PCT No.: PCT/CN2021/112221
§ 371 (c)(1),
(2) Date: Oct. 6, 2022

(87) PCT Pub. No.: WO2022/205735
PCT Pub. Date: Oct. 6, 2022

(65) Prior Publication Data
US 2024/0185901 A1 Jun. 6, 2024

(30) Foreign Application Priority Data
Mar. 29, 2021 (CN) .......................... 20211033856.0

(51) Int. Cl.
G11C 7/22 (2006.01)
G06F 3/06 (2006.01)
(52) U.S. Cl.
CPC .............. G11C 7/22 (2013.01); G06F 3/0679 (2013.01)

(58) Field of Classification Search
CPC .. G11C 7/22; G11C 5/066; G11C 7/10; G11C 7/1045; G11C 7/1066;
(Continued)

(56) References Cited

U.S. PATENT DOCUMENTS 11,133,055 B1 * 9/2021 Kim .................... G11C 11/4096
2010/0302873 A1 12/2010 Lee
2020/0082869 A1 3/2020 Miyamoto

FOREIGN PATENT DOCUMENTS

CN 103560977 A 2/2014
CN 105701041 A 6/2016
(Continued)

OTHER PUBLICATIONS

International Search Report cited in PCT/CN2021/112221 mailed Dec. 29, 2021, 10 pages.

Primary Examiner — Huan Hoang
(74) Attorney, Agent, or Firm — Kilpatrick Townsend & Stockton LLP

(57) ABSTRACT

Provided are a data transmission circuit, a data transmission method, and a storage device. The data transmission circuit includes a controllable delay module and a mode register data processing unit. The controllable delay module is configured to generate a delayed read command in response to a mode register read command. The mode register data processing unit is configured to read setting parameters from a mode register in response to the mode register read command, and to output the setting parameters in response to the delayed read command. Here, a time difference between a start moment of outputting of the setting parameters and a moment when the controllable delay module receives the mode register read command is a first preset threshold.

20 Claims, 9 Drawing Sheets

(58) Field of Classification Search
CPC ..... G11C 7/1093; G11C 7/222; G06F 3/0679; G06F 3/06; G06F 3/0626; G06F 3/0655
USPC ........................................................ 365/194
See application file for complete search history.

(56) References Cited

FOREIGN PATENT DOCUMENTS

| | | |
|---|---|---|
| CN | 110832585 A | 2/2020 |
| CN | 111192611 A | 5/2020 |

\* cited by examiner

DATA TRANSMISSION CIRCUIT, DATA TRANSMISSION METHOD AND STORAGE DEVICE

The present disclosure claims priority to Chinese Patent Application No. 202110333856.0, filed on Mar. 29, 2021 and entitled "Data Transmission Circuit, Data Transmission Method and Storage Device", the disclosure of which is hereby incorporated by reference in its entirety.

TECHNICAL FIELD

The present disclosure relates to, but not limited to, a data transmission circuit, a data transmission method, and a storage device.

BACKGROUND

A semiconductor storage device generally includes a storage array area and a peripheral circuit area, and the storage array area is provided with a storage cell array including a plurality of storage cells. The peripheral circuit area is provided with a control circuit for controlling reading and writing and a mode register for storing setting parameters. The setting parameters stored in the mode register may be read by issuing a mode register read command. If a transmission path for reading the setting parameters in response to the mode register read command and a data transmission path for reading array area data in response to an array area data read command can be set to share a data transmitting channel to accurately output data through a data terminal of the semiconductor storage device, the size of the data transmission circuit can be effectively reduced.

However, different types of semiconductor storage devices spend different time to read the array area data in response to the array area data read command, and working circuits of the different types of semiconductor storage devices are affected by working parameters to different degrees. Therefore, it is unusually complicated to control matching of the time for reading the setting parameters in response to the array area data read command and the time for reading the array area data in response to the array area data read command, and it is difficult to meet the working parameter needs of the different types of semiconductor storage devices. In addition, control errors easily occur to a data transmission path of a semiconductor storage device, which leads to mode register operation errors and seriously affects data transmission accuracy and working efficiency of the semiconductor storage device.

SUMMARY

An aspect of the disclosure provides a data transmission circuit, including a controllable delay module and a mode register data processing unit. The controllable delay module is configured to generate a delayed read command in response to a mode register read command. The mode register data processing unit is connected to the controllable delay module, and is configured to read a setting parameter from a mode register in response to the mode register read command, and to output the setting parameter in response to the delayed read command. Here, a time difference between a start moment of outputting of the setting parameters and a moment when the controllable delay module receives the mode register read command is a first preset threshold.

Another aspect of the disclosure provides a storage device, including a storage cell array, a mode register, and the data transmission circuit described above.

A further aspect of the disclosure provides a data transmission method, including the following steps: a controllable delay module is controlled to generate a delayed read command in response to a mode register read command; a setting parameter is read from the mode register based on a mode register data processing unit in response to the mode register read command; and the setting parameter are output based on the mode register data processing unit in response to the delayed read command. Here, a time difference between a start moment of outputting of the setting parameter and a moment when the controllable delay module receives the mode register read command is a first preset threshold.

The details of various embodiments of the disclosure will be illustrated in the following drawings and description. Based on recordings of the Specification, Drawings, and Claims, those skilled in the art will easily appreciate the other features, the problems to be solved, and the technical effects of the disclosure.

BRIEF DESCRIPTION OF THE DRAWINGS

In order to describe the technical solutions in the embodiments of the disclosure more clearly, the drawings required to be used in descriptions about the embodiments will be simply introduced below. Apparently, the drawings described below are only some embodiments of the disclosure. Additional details or examples for describing the drawings shall not be construed as limiting the scope of any of the disclosures and embodiments currently described or preferred modes in the disclosure.

DETAILED DESCRIPTION OF THE EMBODIMENTS

Figure 1:
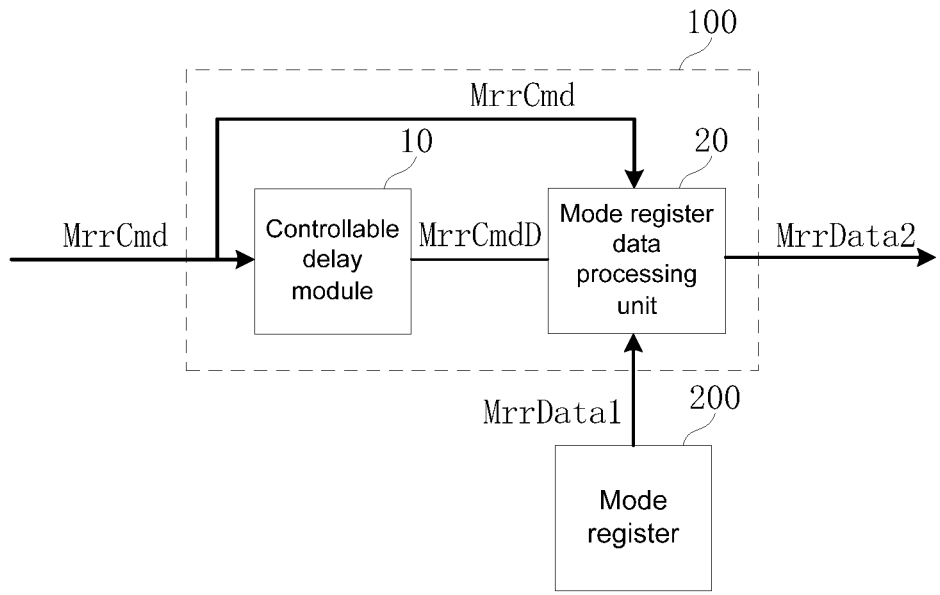
FIG. 1 is a structural block diagram of a data transmission circuit according to a first embodiment of the disclosure.

In order to facilitate an understanding of the disclosure, a more complete description of the disclosure will now be made with reference to the associated drawings. Preferred embodiments of the disclosure are given in the drawings. However, the disclosure may be realized in many different forms and is not limited to the embodiments described herein. Rather, the embodiments are provided so that the content of the disclosure will be made more thorough and comprehensive.

Unless otherwise defined, all technical and scientific terms used herein shall have the same meanings as commonly understood by those skilled in the art to which the disclosure belongs. The terms used herein in the specification of the disclosure are for the purpose of describing the specific embodiments only and are not intended to be limiting of the disclosure.

In addition, certain terms used throughout the specification and the following claims refer to specific elements. Those skilled in the art will appreciate that manufacturers may refer to the elements with different names. This document does not intend to distinguish the elements with different names but same functionality. In the following description and embodiments, both the terms "comprising" and "including" are used openly, and therefore should be interpreted as "comprising, but not limited to . . . ". Likewise, the term "connect" is intended to express an indirect or direct electrical connection. Correspondingly, if one device is connected to another device, the connection may be done through a direct electrical connection, or through an indirect electrical connection of another device and a connector.

It is to be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the disclosure.

Referring to FIG. 1, an embodiment of the disclosure provides a data transmission circuit 100, including a controllable delay module 10 and a mode register data processing unit 20. The controllable delay module 10 is configured to generate a delayed read command MrrCmdD in response to a mode register read command MrrCmd. The mode register data processing unit 20 is connected to the controllable delay module 10, and is configured to read a setting parameter MrrData1 from a mode register 200 in response to the mode register read command MrrCmd, and to output a setting parameter MrrData2 in response to the delayed read command MrrCmdD. Here, a time difference between a start moment of outputting of the setting parameter MrrData2 and a moment when the controllable delay module 10 receives the mode register read command MrrCmd is a first preset threshold.

As an example, with further reference to FIG. 1, the controllable delay module 10 is configured to generate the delayed read command MrrCmdD in response to the mode register read command MrrCmd, so that the mode register data processing unit 20 reads the setting parameter MrrData1 from the mode register 200 in response to the mode register read command MrrCmd, and outputs the setting parameter MrrData2 in response to the delayed read command MrrCmdD. The time difference between the start moment of outputting of the setting parameter MrrData2 and the moment when the controllable delay module 10 receives the mode register read command MrrCmd is the first preset threshold, so that a time for reading the setting parameter MrrData2 in response to the mode register read command MrrCmd matches a time for reading array area data in response to an array area data read command ReadCmd. Once an operation delay of the controllable delay module 10 in the disclosure is determined, little influence is caused by changes in a working environment, and control errors to a data transmission path due to the influence of the working environment can be effectively avoided. In addition, the operation delay of the controllable delay module 10 in the disclosure may be controlled and adjusted to meet working parameter needs of different types of semiconductor storage devices. Here, MrrData1 and MrrData2 may be the same or may match a preset algorithm.

Figure 2:
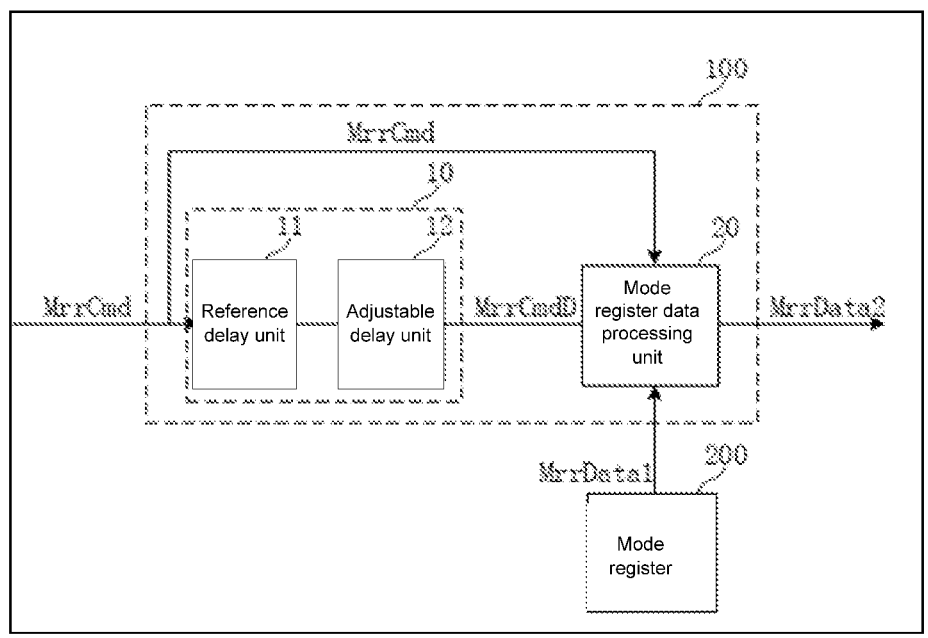
FIG. 2 is a structural block diagram of a data transmission circuit according to a second embodiment of the disclosure.

Further, referring to FIG. 2, in an embodiment of the disclosure, a controllable delay module 10 includes a reference delay unit 11 and an adjustable delay unit 12. The reference delay unit 11 is configured to generate an initial delayed read command MrrCmdD in response to a mode register read command MrrCmd. The adjustable delay unit 12 is connected to both an output end of the reference delay unit 11 and an input end of a mode register data processing unit 20, and is configured to generate a delayed read command MrrCmdD after a preset delay time after receiving the initial delayed read command MrrCmdD. Here, a sum of an operation delay of the reference delay unit 11 and the preset delay time is equal to a first preset threshold. The operation delay of the adjustable delay unit 12 is set to the preset delay time, and the sum of the operation delay of the reference delay unit 11 and the preset delay time is set to be equal to the first preset threshold, so that an operation delay range of the adjustable delay unit 12 is narrowed, improving efficiency and accuracy of adjusting and controlling the operation delay of the controllable delay module 10 as the first preset threshold.

Further, in an embodiment of the disclosure, the adjustable delay unit includes at least two first delay units connected in series. At least one of the first delay units is connected in parallel with a first controllable switch unit. By controlling on and off of each of the first controllable switch units to change the number of the first delay units in the adjustable delay unit that are connected in series between the reference delay unit and the mode register data processing unit, the operation delay of the adjustable delay unit is adjusted.

Figure 3:
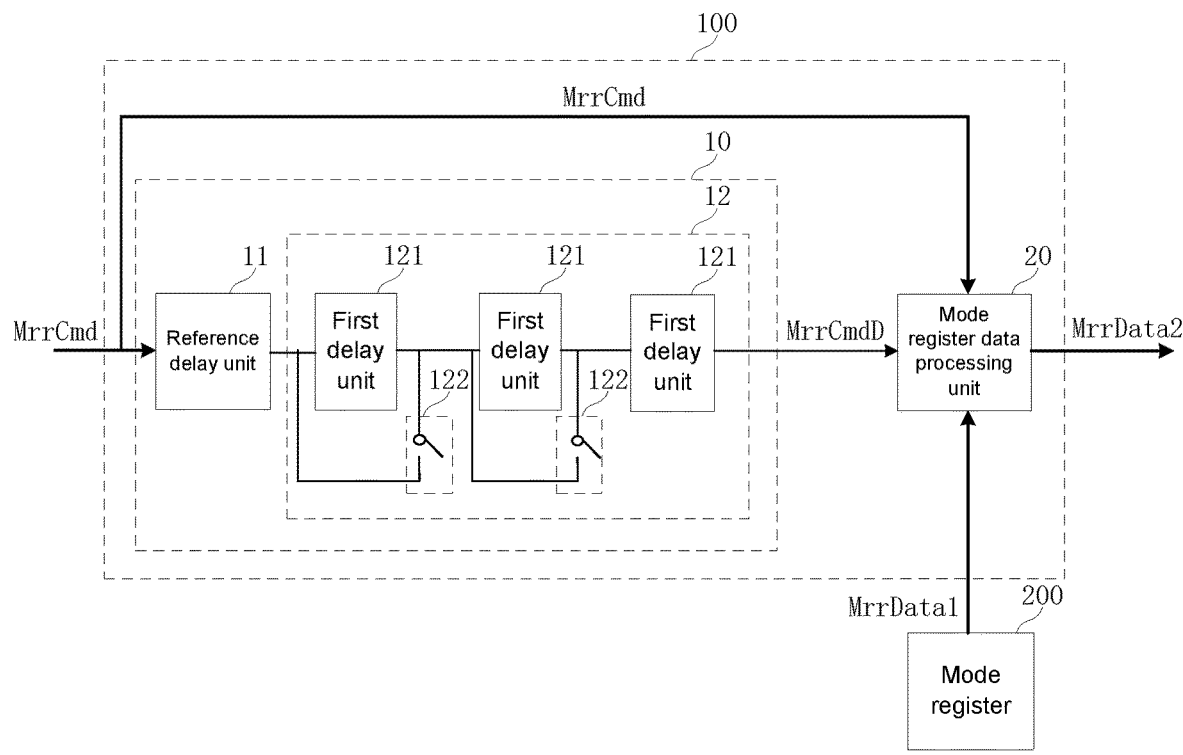
FIG. 3 is a structural block diagram of a data transmission circuit according to a third embodiment of the disclosure.

As an example, referring to FIG. 3, in an embodiment of the disclosure, an adjustable delay unit 12 includes three first delay units 121 connected in series, and two of the first delay units 121 are connected in parallel to two first controllable switch units 122, respectively. By controlling on and off of each of first controllable switch units 122 to change the number of the first delay units 121 in the adjustable delay unit 12 that are connected in series between a reference delay unit 11 and a mode register data processing unit 20, an operation delay of the adjustable delay unit 12 is adjusted, thereby providing gradient control for the operation delay of the adjustable delay unit 12, and improving the efficiency and accuracy of adjusting and controlling the operation delay of a controllable delay module 10 to a first preset threshold.

Figure 4:
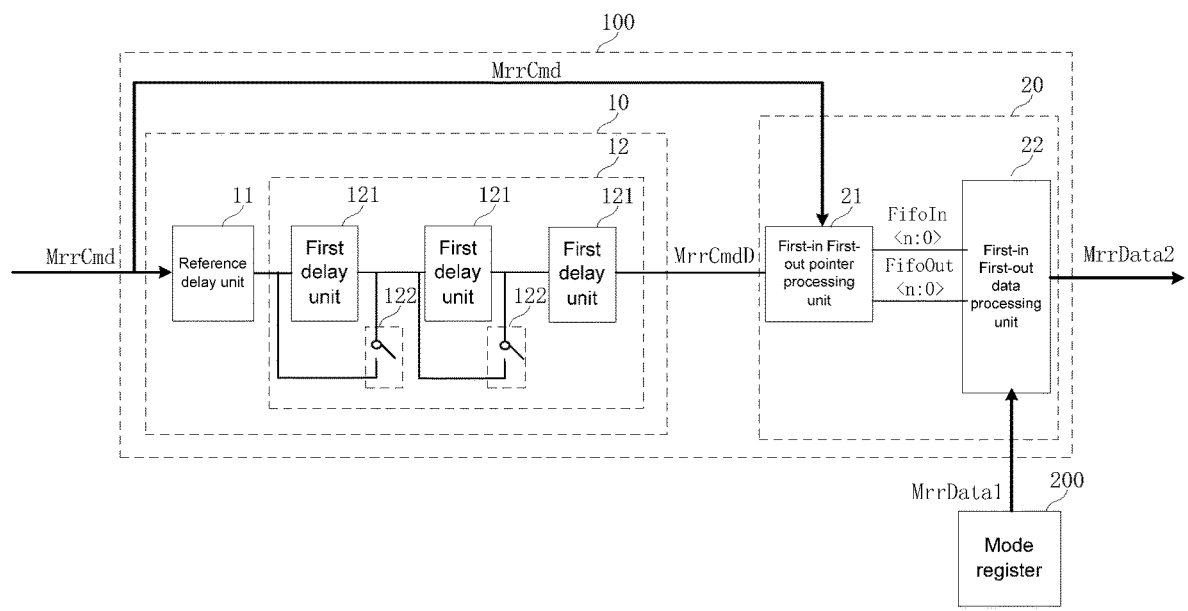
FIG. 4 is a structural block diagram of a data transmission circuit according to a fourth embodiment of the disclosure.

Further, referring to FIG. 4, in an embodiment of the disclosure, a mode register data processing unit 20 further includes a first-in first-out pointer processing unit 21 and a first-in first-out data processing unit 22. The first-in first-out pointer processing unit 21 is connected to an output end of a controllable delay module 10, and is configured to generate a first pointer signal Fifoln<n:0> in response to a mode register read command MrrCmd, and to generate a second pointer signal FifoOut<n:0> in response to a delayed read command MrrCmdD. The first-in first-out data processing unit 22 is connected to both the first-in first-out pointer processing unit 21 and a mode register 200, and is configured to read the setting parameter MrrData1 from the mode register 200 in response to the first pointer signal Fifoln<n:0>, and to output setting parameter MrrData2 in response to the second pointer signal FifoOut<n:0>. The mode register data processing unit 20 is configured to include the first-in first-out pointer processing unit 21 and the first-in first-out data processing unit 22, the first-in first-out pointer processing unit 21 generates, according to the mode register read command MrrCmd, the first pointer signal Fifoln<n:0> for driving the first-in first-out data processing unit 22 to read the setting parameter MrrData1 from the mode register 200, n may be equal to a bit width of the setting parameter MrrData1, and the first-in first-out pointer processing unit 21 also generates, according to the delayed read command MrrCmdD, the second pointer signal FifoOut<n:0> for driving the first-in first-out data processing unit 22 to output the setting parameter MrrData2. Therefore, a time for reading the setting parameter MrrData1 from the mode register 200 in response to the mode register read command MrrCmd is controlled, so that a time for reading the setting parameter MrrData2 in response to the mode register read command MrrCmd can be controlled to match a time for reading array data ArrayData in response to an array area data read command ReadCmd. In an embodiment of the disclosure, the first pointer signal Fifoln<n:0> has a same driving clock frequency as the second pointer signal FifoOut<n:0>, so that a time difference between data read by the first-in first-out data processing unit 22 and data output thereby is precisely controlled.

Further, in an embodiment of the disclosure, the first-in first-out data processing unit includes storage units, and output ends of the plurality of the storage units are all connected to a same node. Each storage unit includes a storage subunit and a driver, an input end of the driver is connected to an output end of the storage subunit, the storage subunit receives the setting parameter under driving of the first pointer signal, and the driver outputs the setting parameter under driving of the second pointer signal.

Figure 5:
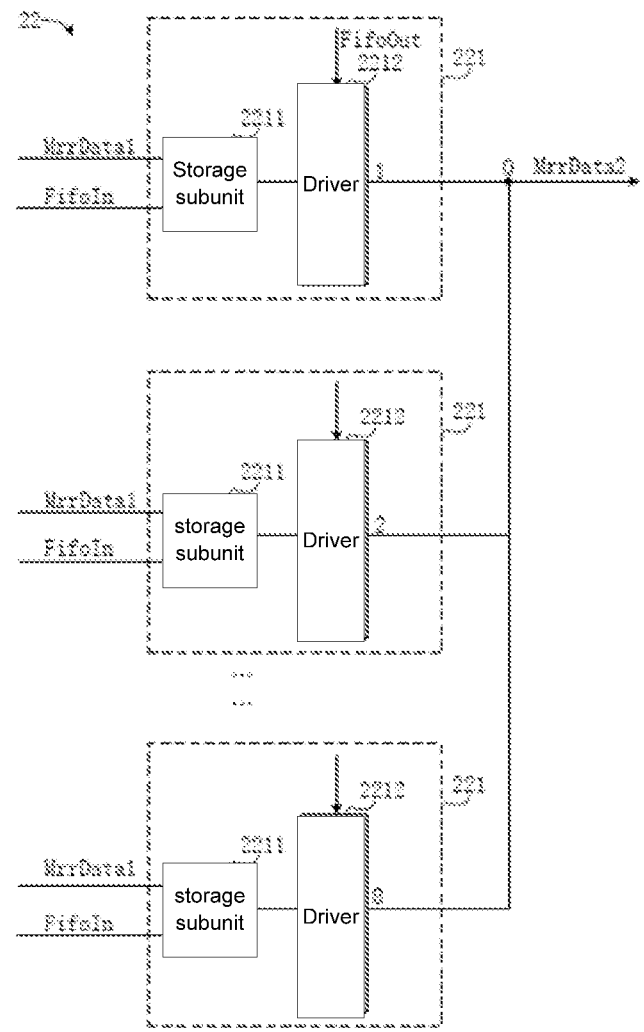
FIG. 5 is a structural block diagram of a first-in first-out data processing unit in a data transmission circuit according to an embodiment of the disclosure.

As an example, referring to FIG. 5, in an embodiment of the disclosure, a first-in-first-out data processing unit 22 includes eight storage units 221, and output ends of the eight storage units 221 are all connected to a node O. Each storage unit 221 includes a storage subunit 2211 and a driver 2212, an input end of the driver 2212 is connected to an output end of the storage subunit 2211, the storage subunit 2211 receives the setting parameter MrrData1 under driving of a first pointer signal Fifoln<n:0>, n=8, and the driver 2212 outputs the setting parameter MrrData2 under driving of a second pointer signal FifoOut<n:0>. Therefore, the first-in first-out data processing unit 22 cooperates with the first-in first-out pointer processing unit 21 to precisely control a time for reading the setting parameter MrrData2 in response to a mode register read command MrrCmd, so that a time for reading the setting parameter MrrData2 in response to the mode register read command MrrCmd can be precisely controlled to match a time for reading array data in response to an array area data read command.

Figure 6:
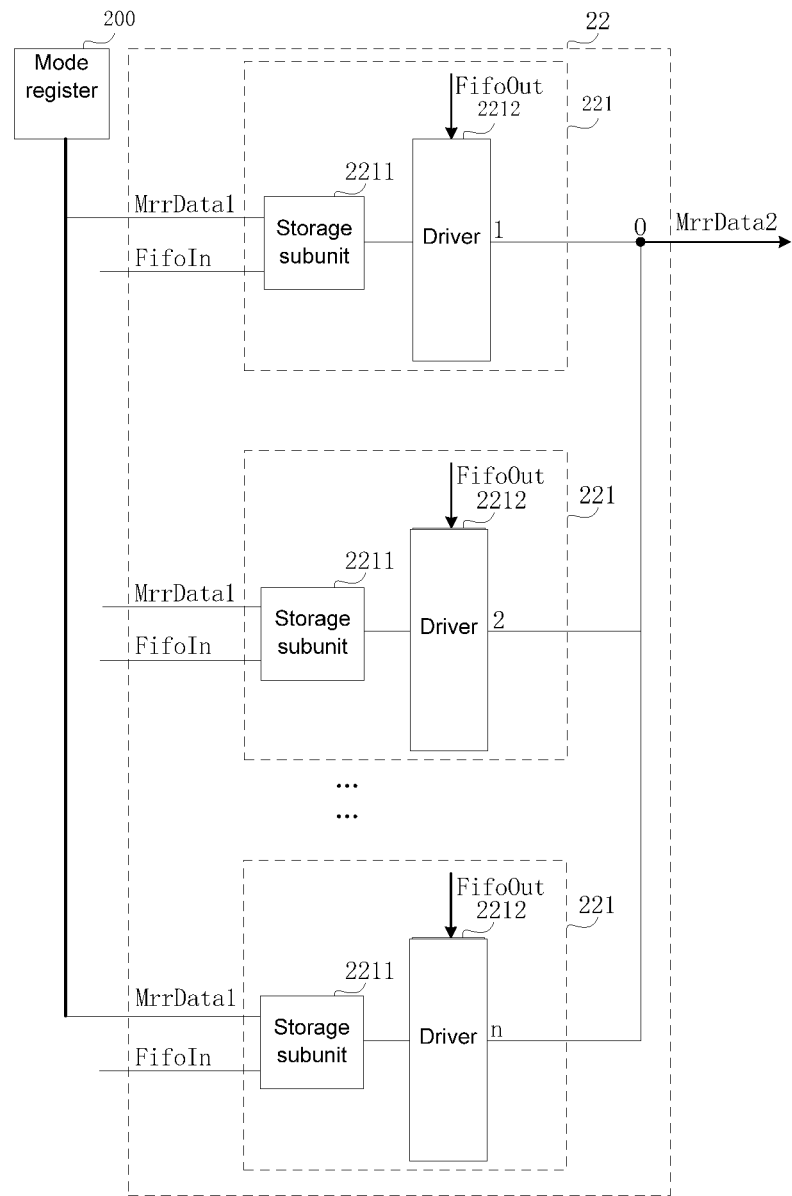
FIG. 6 is a structural block diagram of a first-in first-out data processing unit in a data transmission circuit according to another embodiment of the disclosure.

As an example, referring to FIG. 6, in an embodiment of the disclosure, a data input end of every storage subunit 2211 is connected to a mode register 200, so that each storage subunit 2211 reads the setting parameter MrrData1 from the mode register 200 in response to a first pointer signal Fifoln<n:0>.

Figure 7:
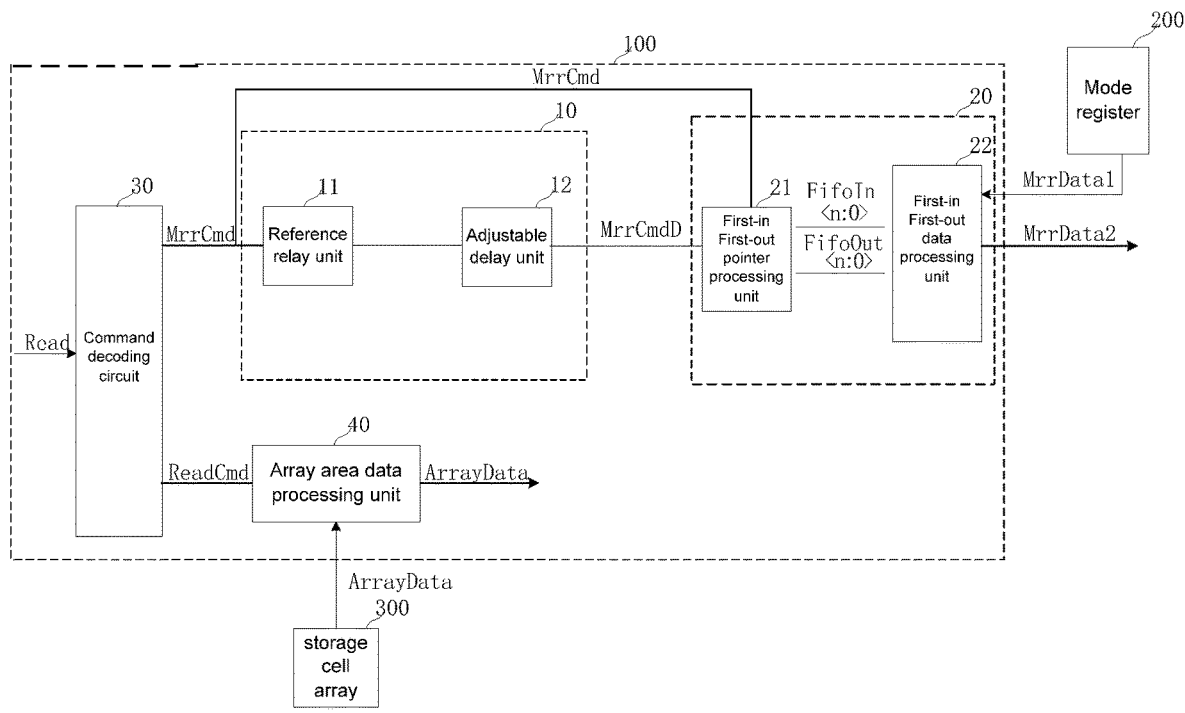
FIG. 7 is a structural block diagram of a data transmission circuit according to a fifth embodiment of the disclosure.

Further, referring to FIG. 7, in an embodiment of the disclosure, a data transmission circuit 100 further includes a command decoding circuit 30 and an array area data processing unit 40, and a first output end of the command decoding circuit 30 is connected to both an input end of a controllable delay module 10 and an input end of a mode register data processing unit 20. The command decoding circuit 30 is configured to receive a read command Read, decode the read command Read, and determine whether the read command Read is a mode register read command MrrCmd. If so, the command decoding circuit 30 outputs the mode register read command MrrCmd. If not, the command decoding circuit 30 generates an array area data read command ReadCmd. An input end of the array area data processing unit 40 is connected to both a second output end of the command decoding circuit 30 and a storage cell array 300, and is configured to read array area data ArrayData from the storage cell array 300 in response to the array area data read command ReadCmd. This embodiment provides that the setting parameter MrrData2 and the array area data ArrayData are read via the data transmission circuit 100. Compared with those employing different data transmission circuits 100 to read the setting parameter MrrData2 and the array area data ArrayData, this embodiment enables a size of the data transmission circuit 100 to be effectively reduced, thereby further improving integrity of a semiconductor storage device.

Further, with further reference to FIG. 7, in an embodiment of the disclosure, a difference between an operation delay of the array area data processing unit 40 and a first preset threshold is a second preset threshold, so that working parameter needs of specific types of semiconductor storage devices, such as a Dynamic Random Access Memory (DRAM), are met.

Figure 8A:
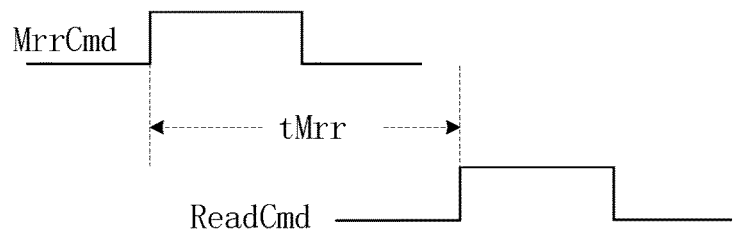
FIG. 8*a* is a schematic diagram of a response time sequence of a data transmission circuit for a read command according to an embodiment of the disclosure.
Figure 8B:
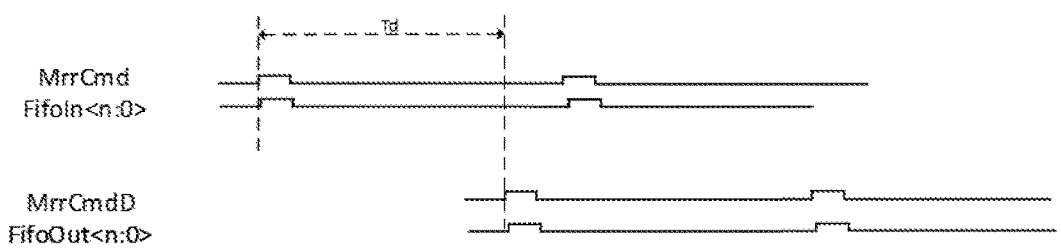
FIG. 8*b* is a schematic diagram of a working sequence of the data transmission circuit shown in FIG. 7.

As an example, referring to FIGS. 8a and 8b, in an embodiment of the disclosure, a first pointer signal Fifoln<n:0> may be set to be the same as a mode register read command MrrCmd in frequency, a second pointer signal FifoOut<n:0> may be set to be the same as a delayed read command MrrCmdD in frequency, a time difference between a drive time of the delayed read command MrrCmdD and a drive time of the mode register read command MrrCmd may be set to a first preset threshold Td, and a difference between an operation delay of an array area data processing unit 40 and the first preset threshold may be set to a second preset threshold, so that a time for reading the setting parameter MrrData2 in response to a mode register read command MrrCmd matches a time for reading array area data ArrayData in response to an array area data read command ReadCmd.

As an example, in an embodiment of the disclosure, a second preset threshold may be set as an integer multiple of a column refresh cycle to meet working parameter needs of specific types of semiconductor storage devices, such as a Low Power Double Data Rate 4 (LPDDR4).

Figure 9:
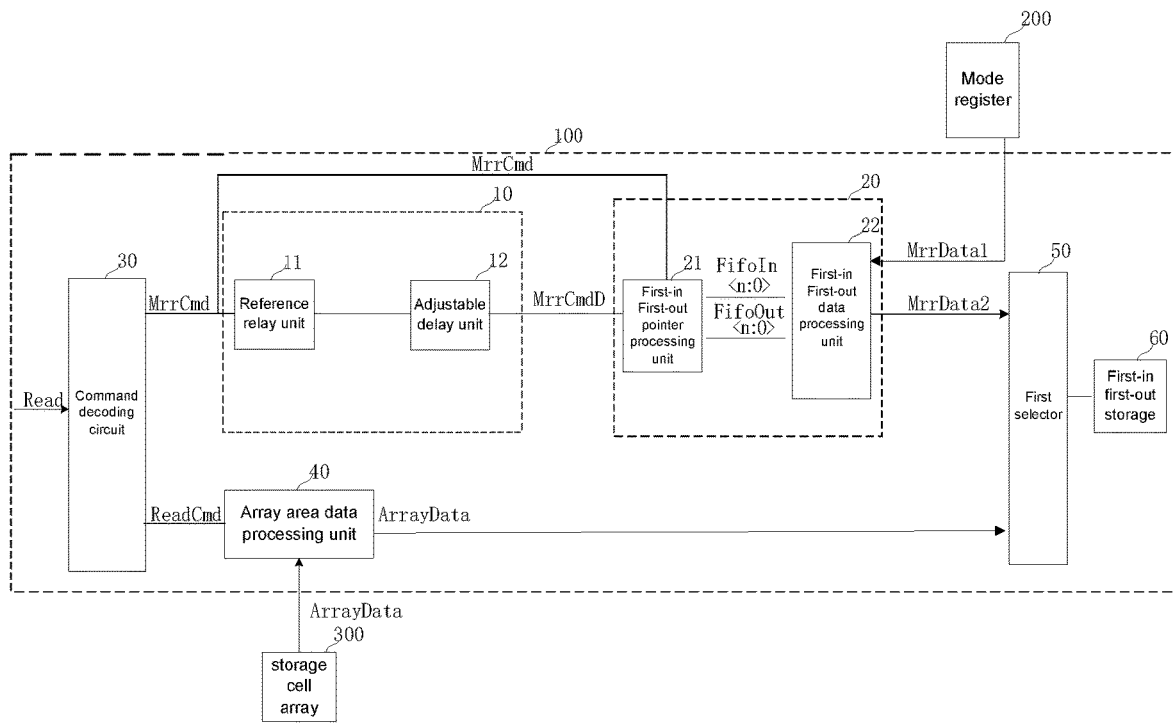
FIG. 9 is a structural block diagram of a data transmission circuit according to a sixth embodiment of the disclosure.

Further, referring to FIG. 9, in an embodiment of the disclosure, a data transmission circuit 100 further includes a first selector 50 and a first-in first-out memory 60, and the first selector 50 is connected to both an output end of an array area data processing unit 40 and an output end of a mode register data processing unit 20. The first-in first-out memory 60 is connected to an output end of the first selector 50, and is configured to store the setting parameter MrrData1 or array area data ArrayData. This embodiment provides that a transmission path reading the setting parameter MrrData2 in response to a mode register read command MrrCmd and a transmission path reading array area data ArrayData in response to an array area data read command ReadCmd share a data transmitting channel, and data is output via the first-in first-out memory 60, so that a size of the data transmission circuit 100 can be effectively reduced.

Figure 10A:
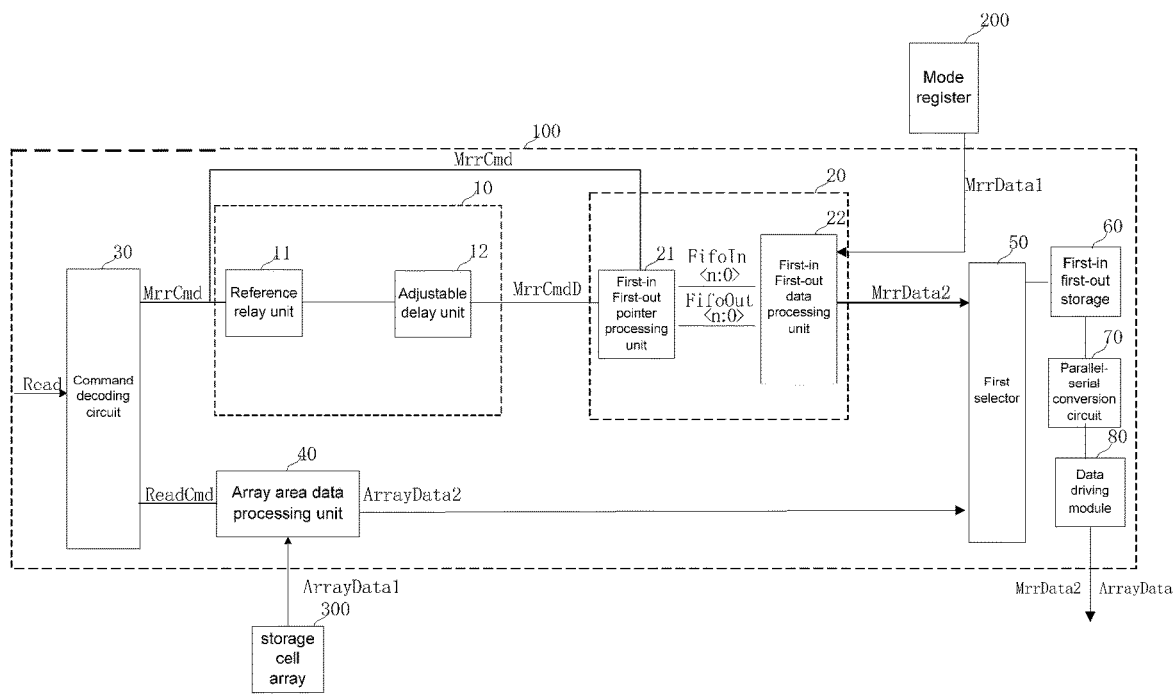
FIG. 10*a* is a structural block diagram of a data transmission circuit according to a seventh embodiment of the disclosure.
Figure 10B:
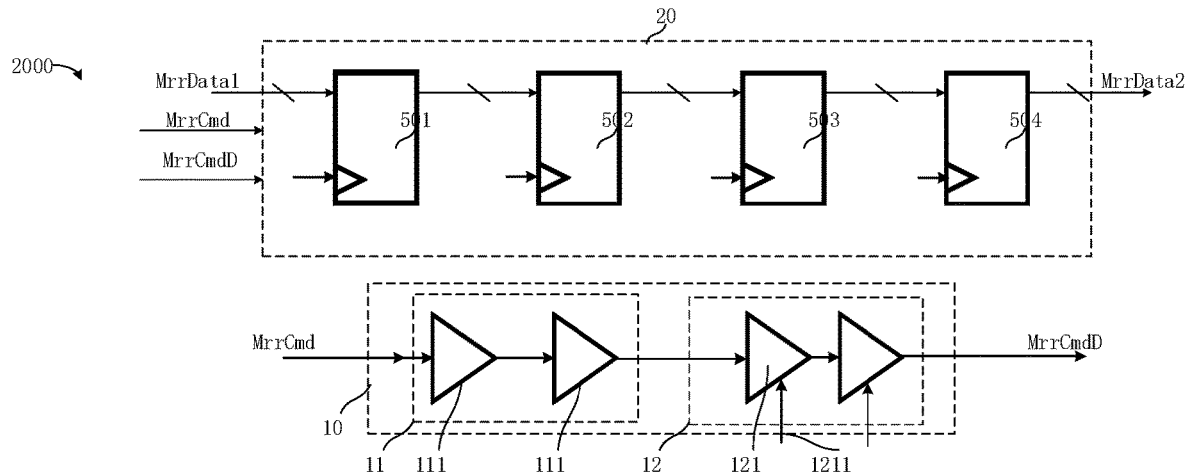
FIG. 10*b* is a schematic diagram of an implementation mode of FIG. 10*a*.

Further, referring to FIGS. 10a and 10b, in an embodiment of the disclosure, a data transmission circuit 100 further includes a parallel-serial conversion circuit 70 and a data driving module 80. The parallel-serial conversion circuit 70 is connected to an output end of a first-in first-out memory 60. The data driving module 80 is connected to an output end of the parallel-serial conversion circuit 70, and is configured to output the setting parameter MrrData2 or array area data ArrayData. The parallel-serial conversion circuit 70 is provided to convert serial data provided by the first-in first-out memory 60 into serial data that is then output via the data driving module 80, so that efficiency of data transmission is improved.

As an example, with further reference to FIG. 10b, a reference delay unit 11 may be set to include several delay subunits 111 connected in series. The delay subunits 111 may be configured to replicate an operation delay for an array area data processing unit 40 to respond to an array area data read command and read, from an array area data path, a functional unit having a fixed delay time, and be configured so that an operation delay of an adjustable delay unit 12 is set to match a delay time for the array area data processing unit 40 to respond to the array area data read command and read, from the array area data path, a functional unit having a variable delay time, thereby providing gradient control for an operation delay of an adjustable delay unit, and improving the efficiency and accuracy of adjusting and controlling the operation delay of the controllable delay module as a first preset threshold. Referring to FIGS. 10a and 10b, for ease of understanding, an example is given. It is assumed that a delay time for the array area data processing unit 40 to read ArrayData1 from a storage cell array 300 in response to an array area data read command ReadCmd and output ArrayData2 is 2.5 nanoseconds. In this way, the reference delay unit 11 may be set to 2 nanoseconds, the adjustable delay unit 12 may be set to 0.5 nanosecond, and a delay time of the adjustable delay unit 12 may be varied within a range, for example, the delay time may be from 0.1 nanosecond to 0.9 nanosecond.

In the disclosure, the controllable delay module 10 is configured to generate a delayed read command MrrCmdD in response to a mode register read command MrrCmd, so that a mode register data processing unit 20 reads the setting parameter MrrData1 from a mode register 200 in response to the mode register read command MrrCmd, and outputs the setting parameter MrrData2 in response to the delayed read command MrrCmdD. A time difference between a start moment of outputting of the setting parameter MrrData2 and a moment when the controllable delay module 10 receives the mode register read command MrrCmd is a first preset threshold, so that a time for reading the setting parameter MrrData2 in response to the mode register read command MrrCmd matches a time for reading the array area data in response to the array area data read command ReadCmd. Once an operation delay of the controllable delay module 10 in the disclosure is determined, little influence is caused by changes in a working environment, and control errors to a data transmission path due to the influence of the working environment can be effectively avoided. In addition, the operation delay of the controllable delay module 10 in the disclosure may be controlled and adjusted to meet working parameter needs of different types of semiconductor storage devices.

Figure 11A:
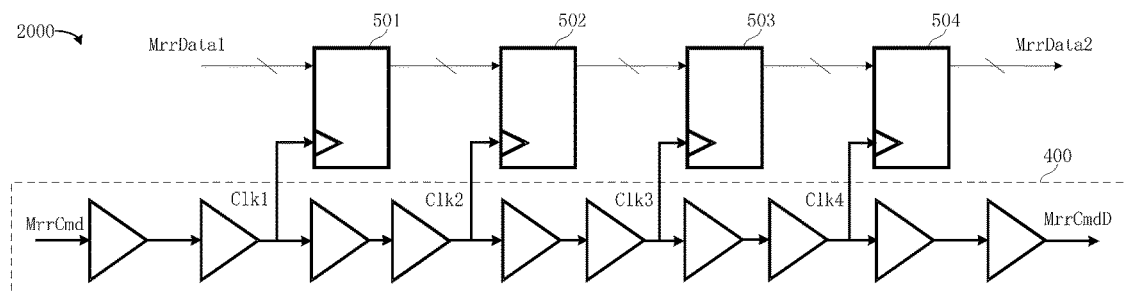
FIG. 11*a* is a structural block diagram of a delay circuit for responding to a mode register read command.
Figure 11B:
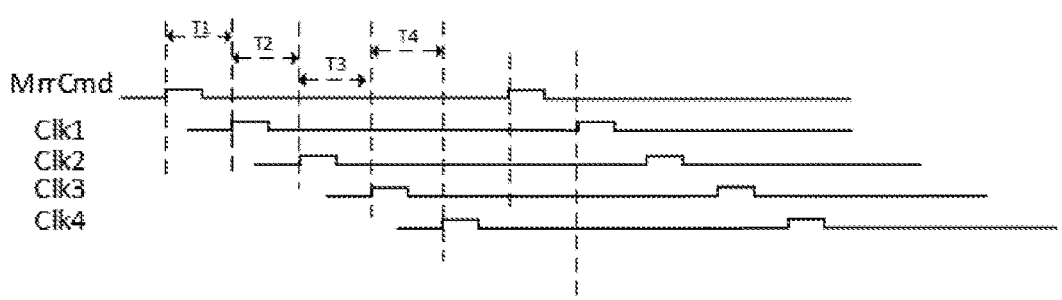
FIG. 11*b* is a schematic diagram of a working time sequence of FIG. 11*a*.

FIG. 11a shows a delay circuit 2000, which is set in a data transmission circuit to read the setting parameter MrrData2 in response to a mode register read command MrrCmd, and FIG. 11b is a schematic diagram of a working time sequence of FIG. 11a. The delay circuit 2000 includes a first trigger 501, a second trigger 502, a third trigger 503, a fourth trigger 504, and a delay chain 400. The delay chain 400 is configured to generate a first clock signal Clk1, a second clock signal Clk2, a third clock signal Clk3, a fourth clock signal Clk4, and a delayed read command MrrCmdD in response to a mode register read command MrrCmd. The first trigger 501 is configured to receive the setting parameter MrrData1 in response to the first clock signal Clk1. The second trigger 502 is configured to receive data provided by the first trigger 501 in response to the second clock signal Clk2. The third trigger 503 is configured to receive data provided by the second trigger 502 in response to the third clock signal Clk3. The fourth trigger 504 is configured to receive data provided by the third trigger 503 in response to the fourth clock signal Clk4 and output the setting parameter MrrData2. By controlling driving times of the first clock signal Clk1, the second clock signal Clk2, the third clock signal Clk3, the fourth clock signal Clk4, and the delayed read command MrrCmdD generated by the delay chain 400, a time for reading the setting parameter MrrData2 in response to the mode register read command MrrCmd is controlled to match a time for reading array area data ArrayData in response to an array area data read command ReadCmd.

Referring to FIGS. 10b and 11a, in both of which, the outputting of the setting parameter MrrData1 in the mode register 200 is realized. When a manufacturing process or temperature or voltage changes greatly, each clock (Clk1, Clk2, Clk3 and Clk4) of FIG. 11a needs to be deployed to ensure a correct time sequence of MrrData1 to MrrData2. In comparison, the technical solution in FIG. 10b allows for easier deployment.

Figure 12:
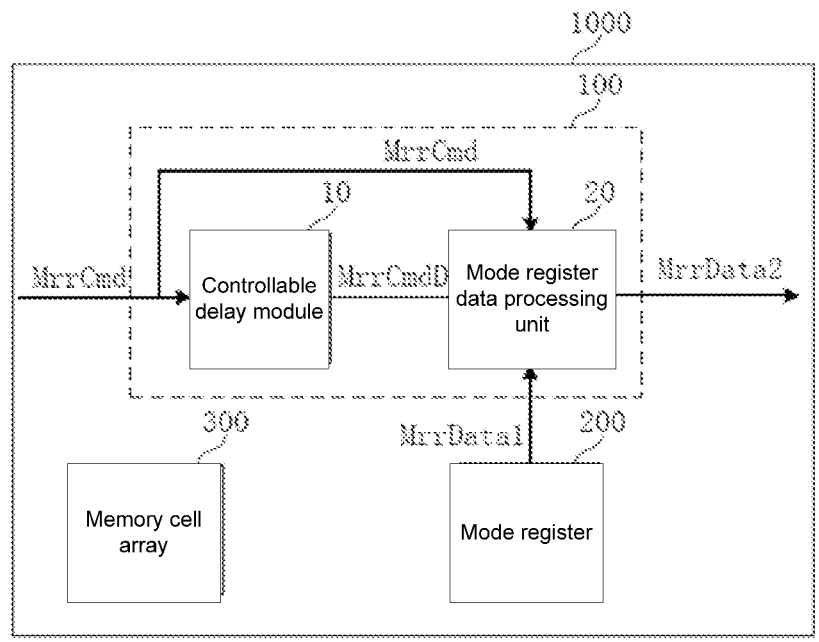
FIG. 12 is a structural block diagram of a storage device according to an embodiment of the disclosure.

Referring to FIG. 12, an embodiment of the disclosure provides a storage device 1000, including a storage cell array 300, a mode register 200, and the data transmission circuit 100 as in any of the embodiments of the disclosure. Since the data transmission circuit 100 as in any of the embodiments of the disclosure is employed to transmit array area data ArrayData and the setting parameter MrrData2, a time for reading the setting parameter MrrData2 in response to a mode register read command MrrCmd is conveniently controlled to match a time for reading the array area data ArrayData in response to an array area data read command ReadCmd. Once an operation delay of the controllable delay module 10 in the disclosure is determined, little influence is caused by changes in a working environment, and control errors to a data transmission path due to the influence of the working environment can be effectively avoided. In addition, the operation delay of the controllable delay module 10 in the disclosure may be controlled and adjusted to meet working parameter needs of different types of semiconductor storage devices 1000.

Figure 13:
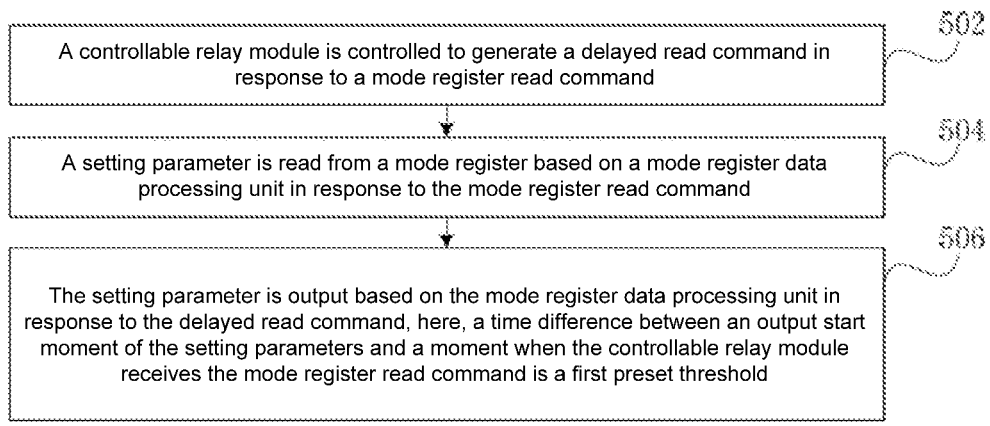
FIG. 13 is a schematic flowchart of a data transmission method according to an embodiment of the disclosure.

Referring to FIG. 13, an embodiment of the disclosure provides a data transmission method, including the following steps.

In step 502, a controllable delay module is controlled to generate a delayed read command in response to a mode register read command.

In step 504, a setting parameter is read from a mode register based on a mode register data processing unit in response to the mode register read command.

In step 506, the setting parameter is output based on the mode register data processing unit in response to the delayed read command. Here, a time difference between a start moment of outputting of the setting parameter and a moment when the controllable delay module receives the mode register read command is a first preset threshold.

Specifically, with further reference to FIGS. 13 and 7, a delayed read command MrrCmdD is generated in response to a mode register read command MrrCmd based on the controllable delay module 10, so that the mode register data processing unit 20 reads the setting parameter MrrData1 from the mode register 200 in response to a mode register read command MrrCmd, and outputs the setting parameter MrrData2 in response to the delayed read command MrrCmdD. The time difference between the start moment of outputting of the setting parameter MrrData2 and the moment when the controllable delay module 10 receives the mode register read command MrrCmd is the first preset threshold, so that a time for reading the setting parameter MrrData2 in response to the mode register read command MrrCmd matches a time for reading array area data ArrayData in response to an array area data read command ReadCmd. Once an operation delay of the controllable delay module 10 in the disclosure is determined, little influence is caused by changes in a working environment, and control errors to a data transmission path due to the influence of the working environment can be effectively avoided. In addition, the operation delay of the controllable delay module 10 in the disclosure may be controlled and adjusted to meet working parameter needs of different types of semiconductor storage devices.

Figure 14:
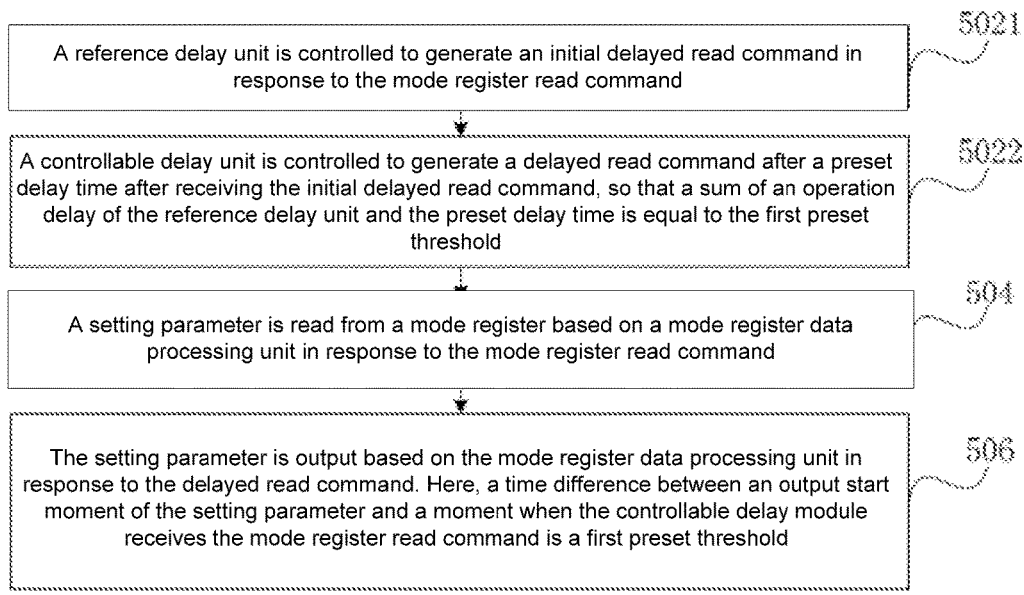
FIG. 14 is a schematic flowchart of a data transmission method according to another embodiment of the disclosure.

Further, referring to FIG. 14, in an embodiment of the disclosure, that the controllable delay module is controlled to generate a delayed read command in response to a mode register read command includes the following steps.

In step 5021, a reference delay unit is controlled to generate an initial delayed read command in response to the mode register read command.

In step 5022, an adjustable delay unit is controlled to generate a delayed read command after a preset delay time after receiving the initial delayed read command, so that a sum of an operation delay of the reference delay unit and the preset delay time is equal to the first preset threshold.

Specifically, referring again to FIGS. 14 and 3, the reference delay unit 11 is controlled to generate an initial delayed read command MrrCmdD in response to a mode register read command MrrCmd, so that the adjustable delay unit 12 generates a delayed read command MrrCmdD after a preset delay time after receiving the initial delayed read command MrrCmdD, and a sum of an operation delay of the reference delay unit 11 and the preset delay time is equal to the first preset threshold. This embodiment can narrow an operation delay range of the adjustable delay unit 12, and improve the efficiency and accuracy of adjusting and controlling the operation delay of the controllable delay module 10 to the first preset threshold.

Figure 15:
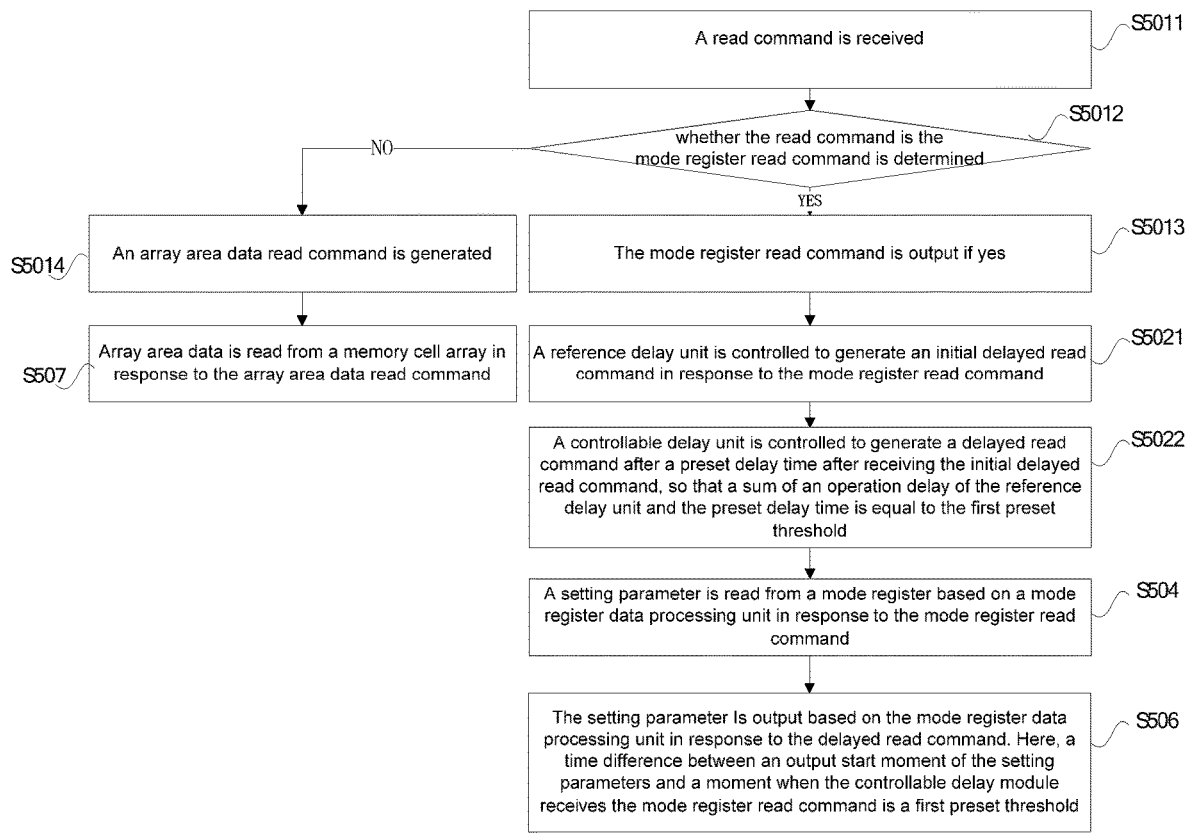
FIG. 15 is a schematic flowchart of a data transmission method according to a further embodiment of the disclosure.

Further, referring to FIG. 15, in an embodiment of the disclosure, before the controllable delay module is controlled to generate a delayed read command in response to a mode register read command, the following steps are further included.

In step 5011, a read command is received.

In step 5012, the read command is decoded, and whether the read command is the mode register read command is determined.

In step 5013, the mode register read command is output if yes.

In step 5014, an array area data read command is generated if not.

In step 507, array area data is read from a storage cell array in response to the array area data read command.

Specifically, with further reference to FIGS. 15 and 10, a read command received is decoded, whether the read command is a mode register read command MrrCmd is determined. If yes, the mode register read command MrrCmd is output. If not, an array area data read command ReadCmd is generated. Array area data ArrayData is read from the storage cell array 300 in response to the array area data read command ReadCmd. The setting parameter MrrData1 is read from the mode register 200 based on the mode register data processing unit 20 in response to the mode register read command MrrCmd. The setting parameter MrrData2 is output based on the mode register data processing unit 20 in response to the delayed read command MrrCmdD. A time difference between a start moment of outputting of the setting parameter MrrData2 and a moment when the controllable delay module 10 receives the mode register read command MrrCmd is a first preset threshold. This embodiment allows the setting parameter MrrData1 in the mode register 200 and the array area data ArrayData to be controlled and read via a same data output path, so that data transmission efficiency is improved, a size of the data output path is effectively reduced, and integrity of a semiconductor storage device is further improved.

For the specific limitations to the data transmission method in the above embodiments, refer to the above limitations to a data transmission device. No elaborations are made here.

It is to be understood that, although the various steps in the flowcharts of FIGS. 13-15 are displayed in sequence as indicated by the arrows, these steps are not necessarily executed in sequence in the order indicated by the arrows. Unless otherwise specified herein, there is no strict order for the execution of these steps, and these steps can be executed in other orders. Moreover, at least part of the steps in FIGS. 13-15 may include a plurality of steps or a plurality of stages. These steps or stages are not necessarily executed at a same time, but can be executed at different times. These steps or stages are not necessarily executed in sequence, but may be executed in turns or alternately with other steps or at least a part of the steps or stages in other steps.

Those of ordinary skill in the art will appreciate that implementing all or part of the processes in the methods described above may be accomplished by instructing associated hardware by a computer program, which may be stored in a non-volatile computer-readable storage medium, which, when executed, may include processes as embodiments of the methods described above. Any reference to a memory, storage, a database, or other media used in the embodiments provided herein may include nonvolatile and/or volatile memories. A nonvolatile memory may include a Read-Only Memory (ROM), a Programmable ROM (PROM), an Electrically Programmable ROM (EPROM), an Electrically Erasable Programmable ROM (EEPROM), or a flash memory. A volatile memory may include a Random Access Memory (RAM) or an external cache memory. As not a limitation but an illustration, the RAM is available in many forms, such as a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchronous Chain Channel (Synchlink) DRAM (SLDRAM), a Direct Memory Bus Dynamic RAM (DRDRAM), and a Memory Bus Dynamic RAM (RDRAM), among others.

Note that the above-described embodiments are only intended for illustrative purposes and are not meant to limit the disclosure.

The technical features of the above-described embodiments may be randomly combined, and not all possible combinations of the technical features in the above-described embodiments are described for simplicity of description, however, as long as the combinations of the technical features do not contradict each other, they should be considered to be within the scope of the description of the present specification.

The embodiments described above represent only several implementation modes of the disclosure, and the description thereof is specific and detailed, but should not be construed as limiting the scope of disclosure accordingly. It should be pointed out that those of ordinary skill in the art can also make some modifications and improvements without departing from the concept of the disclosure, and these modifications and improvements all fall within the scope of protection of the disclosure. Accordingly, the scope of the patent of this application should be subject to the appended claims.

What is claimed is:

1. A data transmission circuit, comprising:
    a controllable delay module, configured to generate a delayed read command in response to a mode register read command; and
    a mode register data processing unit, connected to the controllable delay module, and configured to read a setting parameter from a mode register in response to the mode register read command, and to output the setting parameter in response to the delayed read command;
    wherein a time difference between a start moment of outputting of the setting parameter and a moment when the controllable delay module receives the mode register read command is a first preset threshold.

2. The data transmission circuit according to claim 1, wherein the controllable delay module comprises:
    a reference delay unit, configured to generate an initial delayed read command in response to the mode register read command; and
    an adjustable delay unit, connected to an output end of the reference delay unit and an input end of the mode register data processing unit, and configured to generate the delayed read command after a preset delay time from receiving the initial delayed read command;
    wherein, a sum of an operation delay of the reference delay unit and the preset delay time is equal to the first preset threshold.

3. The data transmission circuit according to claim 2, wherein the adjustable delay module comprises at least two first delay units connected in series; and
    at least one of the first delay units is connected in parallel with a first controllable switch unit;
    wherein by controlling on and off of each of the first controllable switch units to change a number of the first delay units in the adjustable delay unit that are connected in series between the reference delay unit and the mode register data processing unit, so as to adjust an operation delay of the adjustable delay unit.

4. The data transmission circuit according to claim 1, wherein the mode register data processing unit further comprises:
    a first-in first-out pointer processing unit, connected to an output end of the controllable delay module, and configured to generate a first pointer signal in response to the mode register read command, and to generate a second pointer signal in response to the delayed read command; and
    a first-in first-out data processing unit, connected to the first-in first-out pointer processing unit and the mode register, and configured to read the setting parameter from the mode register in response to the first pointer signal, and to output the setting parameter in response to the second pointer signal.

5. The data transmission circuit according to claim 4, wherein the first pointer signal has a same driving clock frequency as the second pointer signal.

6. The data transmission circuit according to claim 4, wherein the first-in first-out data processing unit comprises:
    a plurality of storage units, output ends of the plurality of storage units being all connected to a same node;
    wherein each storage unit includes a storage subunit and a driver, an input end of the driver is connected to an output end of the storage subunit, the storage subunit is driven by the first pointer signal to receive the setting parameter, and the driver is driven by the second pointer signal to output the setting parameter.

7. The data transmission circuit according to claim 6, wherein a data input end of every storage subunit is connected to the mode register.

8. The data transmission circuit according to claim 1, wherein the data transmission circuit further comprises:
    a command decoding circuit, having a first output end connected to both an input end of the controllable delay module and an input end of the mode register data processing unit, and being configured to receive a read command, decode the read command, determine whether the read command is the mode register read command, output the mode register read command if yes, and generate an array area data read command if not; and
    an array area data processing unit, having an input end connected to both a second output end of the command decoding circuit and a storage cell array, and being configured to read array area data from the storage cell array in response to the array area data read command.

9. The data transmission circuit according to claim 8, wherein a difference between an operation delay of the array area data processing unit and the first preset threshold is a second preset threshold.

10. The data transmission circuit according to claim 9, wherein the second preset threshold is an integer multiple of a column refresh cycle.

11. The data transmission circuit according to claim 9, wherein the data transmission circuit further comprises:
    a first selector, connected to an output end of the array area data processing unit and an output end of the mode register data processing unit; and a first-in first-out memory, connected to an output end of the first selector, and configured to store the setting parameter or the array area data.

12. The data transmission circuit according to claim 11, wherein the data transmission circuit further comprises:
a parallel-serial conversion circuit, connected to an output end of the first-in first-out memory; and
a data driving module, connected to an output end of the parallel-serial conversion circuit, and configured to output the setting parameter or the array area data.

13. A storage device, comprising:
a storage cell array, configured to store array area data;
a mode register, configured to store a setting parameter; and
a data transmission circuit, wherein the data transmission circuit comprises:
a controllable delay module, configured to generate a delayed read command in response to a mode register read command; and
a mode register data processing unit, connected to the controllable delay module, and configured to read a setting parameter from the mode register in response to the mode register read command, and to output the setting parameter in response to the delayed read command;
wherein a time difference between a start moment of outputting of the setting parameter and a moment when the controllable delay module receives the mode register read command is a first preset threshold.

14. The storage device according to claim 13, wherein the controllable delay module comprises:
a reference delay unit, configured to generate an initial delayed read command in response to the mode register read command; and
an adjustable delay unit, connected to an output end of the reference delay unit and an input end of the mode register data processing unit, and configured to generate the delayed read command after a preset delay time from receiving the initial delayed read command;
wherein, a sum of an operation delay of the reference delay unit and the preset delay time is equal to the first preset threshold.

15. The storage device according to claim 14, wherein the adjustable delay module comprises at least two first delay units connected in series; and
at least one of the first delay units is connected in parallel with a first controllable switch unit;
wherein by controlling on and off of each of the first controllable switch units to change a number of the first delay units in the adjustable delay unit that are connected in series between the reference delay unit and the mode register data processing unit, so as to adjust an operation delay of the adjustable delay unit.

16. The storage device according to claim 13, wherein the mode register data processing unit further comprises:

a first-in first-out pointer processing unit, connected to an output end of the controllable delay module, and configured to generate a first pointer signal in response to the mode register read command, and to generate a second pointer signal in response to the delayed read command; and
a first-in first-out data processing unit, connected to the first-in first-out pointer processing unit and the mode register, and configured to the read setting parameter from the mode register in response to the first pointer signal, and to output the setting parameter in response to the second pointer signal.

17. The storage device according to claim 16, wherein the first pointer signal has a same driving clock frequency as the second pointer signal.

18. A data transmission method, comprising:
controlling a controllable delay module to generate a delayed read command in response to a mode register read command;
reading a setting parameter from a mode register based on a mode register data processing unit in response to the mode register read command; and
outputting the setting parameter based on the mode register data processing unit in response to the delayed read command, wherein a time difference between a start moment of outputting of the setting parameter and a moment when the controllable delay module receives the mode register read command is a first preset threshold.

19. The data transmission method according to claim 18, wherein controlling the controllable delay module to generate the delayed read command in response to the mode register read command comprises:
controlling a reference delay unit to generate an initial delayed read command in response to the mode register read command; and
controlling an adjustable delay unit to generate the delayed read command after a preset delay time from receiving the initial delayed read command, so that a sum of an operation delay of the reference delay unit and the preset delay time is equal to the first preset threshold.

20. The data transmission method according to claim 18, wherein before controlling the controllable delay module to generate the delayed read command in response to the mode register read command, the method further comprises:
receiving a read command;
decoding the read command, and determining whether the read command is the mode register read command;
outputting the mode register read command if the read command is the mode register read command;
generating an array area data read command if the read command is not the mode register read command; and
reading array area data from a storage cell array in response to the array area data read command.

* * * * *